US012563856B2

(12) United States Patent
Zhang et al.

(10) Patent No.: US 12,563,856 B2
(45) Date of Patent: Feb. 24, 2026

(54) LAMINATED PASSIVATION STRUCTURE OF SOLAR CELL AND PREPARATION METHOD THEREOF

(71) Applicant: HANWHA SOLUTION CORPORATION, Seoul (KR)

(72) Inventors: Xueling Zhang, Jiangsu (CN); Wei Liu, Jaingsu (CN); Hong Chen, Jiangsu (CN); Lei Jian, Jaingsu (CN); Yifeng Chen, Jiangsu (CN)

(73) Assignee: Hanwha Solutions Corporation, Seoul (KR)

( * ) Notice: Subject to any disclaimer, the term of this patent is extended or adjusted under 35 U.S.C. 154(b) by 595 days.

(21) Appl. No.: 17/434,085

(22) PCT Filed: May 21, 2021

(86) PCT No.: PCT/CN2021/095128
§ 371 (c)(1),
(2) Date: Aug. 26, 2021

(87) PCT Pub. No.: WO2022/156102
PCT Pub. Date: Jul. 28, 2022

(65) Prior Publication Data
US 2023/0136715 A1 May 4, 2023

(30) Foreign Application Priority Data

Jan. 19, 2021 (CN) .......................... 202110065969.7
Apr. 14, 2021 (CN) .......................... 202110396614.6

(51) Int. Cl.
*H10F 71/00* (2025.01)
*H10F 10/14* (2025.01)
(Continued)

(52) U.S. Cl.
CPC ........... *H10F 71/128* (2025.01); *H10F 10/14* (2025.01); *H10F 71/1221* (2025.01); *H10F 77/211* (2025.01); *H10F 77/315* (2025.01)

(58) Field of Classification Search
CPC ........... H01L 31/1864; H01L 31/02168; H01L 31/022425; H01L 31/068; H01L 31/182; (Continued)

(56) References Cited

U.S. PATENT DOCUMENTS

2011/0197964 A1* 8/2011 Jang ...................... H01L 31/068
136/256
2016/0284883 A1* 9/2016 Feng ...................... H10F 77/311
(Continued)

FOREIGN PATENT DOCUMENTS

CN 101964378 A 2/2011
CN 102054898 A * 5/2011
(Continued)

OTHER PUBLICATIONS

Extended European Search Report; European Patent Office; Patent Application No. 21755884.0; Aug. 12, 2022; 26 pages.
(Continued)

*Primary Examiner* — Michael Y Sun
(74) *Attorney, Agent, or Firm* — Sughrue Mion, PLLC

(57) ABSTRACT

A laminated passivation structure of solar cell and a preparation method thereof are disclosed herein. The laminated passivation structure of solar cell includes a P-type silicon substrate, a first dielectric layer, a second dielectric layer, and a third dielectric layer sequentially arranged on the back side of the P-type silicon substrate from inside to outside. The preparation method includes generating a first dielectric layer on the back surface of the P-type silicon substrate, and then sequentially depositing a second dielectric layer and a third dielectric layer on the first dielectric layer.

11 Claims, 5 Drawing Sheets

(51) Int. Cl.
*H10F 77/20* (2025.01)
*H10F 77/30* (2025.01)

(58) Field of Classification Search
CPC .......... H01L 31/02167; H01L 31/1868; H01L
31/18; Y02E 10/547; Y02E 10/50
See application file for complete search history.

(56) References Cited

U.S. PATENT DOCUMENTS

| | | | | |
|---|---|---|---|---|
| 2017/0222071 A1* | 8/2017 | Ji | ..................... | H01L 31/022433 |
| 2017/0236972 A1* | 8/2017 | Chung | .................... | H01L 31/18 |
| | | | | 438/87 |
| 2023/0137353 A1* | 5/2023 | Li | ..................... | H01L 31/02168 |
| | | | | 136/256 |

FOREIGN PATENT DOCUMENTS

| | | | | | |
|---|---|---|---|---|---|
| CN | 102097514 | A | | 6/2011 | |
| CN | 109087956 | A | | 12/2018 | |
| CN | 110690296 | A | | 1/2020 | |
| CN | 111987191 | A | | 11/2020 | |
| CN | 211929505 | U | | 11/2020 | |
| CN | 112201715 | A | * | 1/2021 | ....... H01L 31/02167 |
| CN | 112713204 | A | | 4/2021 | |
| CN | 214898453 | U | | 11/2021 | |
| JP | 6788144 | B1 | | 11/2020 | |
| JP | 2021-190671 | A | | 12/2021 | |
| JP | 6982947 | B1 | | 12/2021 | |
| WO | 2019242761 | A1 | | 12/2019 | |

OTHER PUBLICATIONS

International Search Report; China National Intellectual Property Administration; International Application No. PCT/CN2021/095128; Oct. 20, 2021; 4 pages.
Written Opinion of the International Searching Authority; China National Intellectual Property Administration; International Application No. PCT/CN2021/095128; Oct. 20, 2021; 4 pages.
Korean Office Action dated Jan. 24, 2025 in Application No. 10-2023-7024818.
Chinese Office Action dated Dec. 28, 2024 in Application No. 202110396614.6.
Australian Office Action dated Jan. 7, 2025 in Application No. 2021422021.

\* cited by examiner

1

8

1

LAMINATED PASSIVATION STRUCTURE OF SOLAR CELL AND PREPARATION METHOD THEREOF

CROSS REFERENCE TO RELATED APPLICATIONS

This application is a U.S. national stage filing of International Patent Application No. PCT/CN2021/095128 filed May 21, 2021, which claims priority to Chinese Application No. 202110065969.7 filed Jan. 19, 2021 and also claims priority to Chinese Application No. 202110396614.6 filed Apr. 14, 2021, the contents of each application hereby incorporated by reference in their entirety.

TECHNICAL FIELD

The present application pertains to the technical field of photovoltaics, and relates to a laminated passivation structure of a solar cell and a preparation method thereof.

BACKGROUND

Solar energy is an inexhaustible renewable energy source for human beings. Among the effective utilization of solar energy, solar photovoltaic utilization is the fastest growing and most dynamic research field in recent years, and it is one of the most high-profile projects. Monocrystalline silicon solar cells have the highest conversion efficiency and technologies as well as being the most mature. For traditional P-type all-aluminum back-field solar cells, recombination at the back-surface metal and silicon contact area, that is, the formation of the all-aluminum back field by the all-aluminum doping on the back surface is the key factor limiting the further improvement of efficiency. At the same time, the all-aluminum back field has lower long-wave reflectivity and higher optical loss. In order to solve such problems, major research institutions at home and abroad focus on the passivation treatment and structural improvement of the surface of high-efficiency cells. By introducing back passivation film and local aluminum back field technology, recombination at the metal and silicon contact interface is reduced while increasing the long-wave reflection of the back surface, thereby greatly improving the open-circuit voltage (Voc) and short-circuit current (Isc) of the cells, and the photoelectric conversion efficiency of solar cells is increased by 1% or more for P-type passivated emitter and rear cell (PERC) cells. The process route is relatively simple and compatible with existing cell production lines. Therefore, it has been quickly promoted and applied on a large scale, and currently, the market share of PERC cells has reached 90% or more. In order to further improve the conversion efficiency of PERC cells, the surface of the cells must be well passivated to reduce the surface recombination and increase the open-circuit voltage of the cells.

CN111987191A discloses a method for repairing laser film opening damage of PERC cells, comprising texturing the front and back surfaces of a P-type monocrystalline silicon wafer, and performing phosphorus diffusion on the front and/or back surfaces to form a phosphorus-doped surface; locally doping the front surface of the P-type monocrystalline silicon wafer by a laser to produce a selective emitter; after backside etching, thermal oxidation, depositing a laminate of aluminum oxide ($Al_2O_3$) and silicon nitride ($SiN_x$) or a laminate of silicon nitride and silicon oxynitride ($SiO_xN_y$) on the back surface and depositing a passivation anti-reflection layer on the front surface, performing laser film opening and damage repair, realizing the solid phase epitaxial growth of the damaged area, and recrystallizing the crystalline silicon to restore an orderly arrangement.

CN211929505U relates to a crystalline silicon solar cell. Wherein the passivation layer is a laminate of an aluminum oxide layer and a silicon nitride layer, and the passivation layer has a thickness of 110 nm to 140 nm, and the silicon nitride layer is arranged on the bottom surface of the aluminum oxide layer.

The current industrialized PERC cells are based on the result of the laminated passivation of aluminum oxide and silicon nitride on the back surface. Special gases such as trimethylaluminum (TMA), etc., are used in the deposition process of aluminum oxide film, which has a high production cost and is dangerous. On the basis of ensuring the passivation effect, the production cost and dangerousness of the above solution need to be further improved.

SUMMARY

The objective of the present application is to provide a laminated passivation structure of solar cell and the preparation method thereof. The laminated passivation structure of solar cell has a good passivation effect and a low production cost.

To achieve this objective, the present application adopts the following technical solutions:

In a first aspect, the present application provides a laminated passivation structure of a solar cell. The laminated passivation structure of solar cell comprises a P-type silicon substrate, and a first dielectric layer, a second dielectric layer, and a third dielectric layer sequentially arranged on the back surface of the P-type silicon substrate from inside to outside.

In the laminated passivation structure of the solar cell provided in the present application, the first dielectric layer functions to reduce the density of the dangling bonds of the film, which has good control of the interface traps, and results in a chemical passivation effect. The second dielectric layer functions due to a large amount of hydrogen in the film during the deposition of the film, which can form a chemical passivation and a bulk passivation on the surface of the silicon wafer; at the same time, after the second dielectric layer is deposited at a low power, the bombardment of the first dielectric layer by the high-power plasma during the deposition of the third dielectric layer can be avoided; the third dielectric layer and the second dielectric layer have similar functions, but the refractive index of the second dielectric layer is between that of the first dielectric layer and that of the third dielectric layer, such a film layer design can better increase the light reflection on the back surface and increase the current. There are a large number of free hydrogen atoms and hydrogen ions in the second dielectric layer and the third dielectric layer, which can diffuse to the silicon-silicon oxide interface, combine with the silicon dangling bonds at the interface, and reduce the interface state density of the surface to achieve the effect of reducing the surface recombination rate to passivate the surface of the cells. At the same time, hydrogen will also diffuse into the bulk of the silicon wafer to passivate defects and impurities in the bulk of the silicon wafer.

In the laminated passivation structure of solar cell provided in the present application, the back laminated passivation structure is rich in hydrogen ions or atoms, which will be injected into the surface and interior of the silicon wafer during the subsequent annealing process or sintering process, so that the recombination center is passivated. Therefore, the passivation structure of solar cell provided by the present application has a good passivation effect.

The following are optional technical solutions for the present application, but not as limitations to the technical solutions provided by the present application. Through the following optional technical solutions, the technical objectives and beneficial effects of the present application can be better achieved and realized.

As an optional technical solution for the present application, the first dielectric layer comprises a silicon-containing layer.

Optionally, the first dielectric layer is a silicon oxide (SiO$_x$) layer.

Optionally, the thickness of the first dielectric layer is 1 to 10 nm, for example, 1 nm, 2 nm, 3 nm, 4 nm, 5 nm, 6 nm, 7 nm, 8 nm, 9 nm, or 10 nm, etc.

In the present application, if the thickness of the first dielectric layer is too thin, the chemical passivation effect will be unstable; if the thickness of the first dielectric layer is too thick, it will hinder the diffusion of hydrogen ions or atoms to the silicon-silicon oxide interface and affect the passivation effect.

As an optional technical solution of the present application, the second dielectric layer comprises a silicon-containing layer.

Optionally, the second dielectric layer is any one or a combination of at least two of a silicon oxynitride layer, a silicon nitride layer, and a silicon carbide layer.

Optionally, the thickness of the second dielectric layer is 1 to 150 nm, for example, 1 nm, 10 nm, 20 nm, 30 nm, 40 nm, 50 nm, 60 nm, 70 nm, 80 nm, 100 nm, 125 nm or 150 nm, etc.

In the present application, if the thickness of the second dielectric layer is too thick, a high-energy laser is required for the back-surface laser grooving. The high energy of the laser causes a reduction in the lifetime of the silicon wafer and reduces the conversion efficiency of the cells. If the thickness of the second dielectric layer is too thick or too thin, the back reflection effect will also be weakened at the same time.

Optionally, the second dielectric layer is deposited by a Plasma Enhanced Chemical Vapor Deposition (PECVD) method, with a thickness of 1 to 100 nm.

Optionally, the refractive index of the second dielectric layer is 1.5 to 2.4, for example, 1.5, 1.6, 1.7, 1.8, 1.9, 2.0, 2.1, 2.2, 2.3 or 2.4, etc.

Optionally, the second dielectric layer is a laminated film structure with different refractive indexes.

Optionally, the second dielectric layer is a laminated film structure of silicon oxynitride with a refractive index ranging from 1.6 to 2.2 (for example, a refractive index of 1.6, 1.7, 1.8, 1.9, 2.0, 2.1, or 2.2, etc.) and silicon oxynitride with a refractive index ranging from 1.7 to 2.4 (for example, a refractive index of 1.7, 1.8, 1.9, 2.0, 2.1, 2.2, 2.3, or 2.4, etc.).

Optionally, the second dielectric layer is a laminated film structure of silicon oxynitride with a refractive index ranging from 1.6 to 2.2 (for example, a refractive index of 1.6, 1.7, 1.8, 1.9, 2.0, 2.1, or 2.2, etc.) and silicon carbide with a refractive index ranging from 1.7 to 2.4 (for example, a refractive index of 1.7, 1.8, 1.9, 2.0, 2.1, 2.2, 2.3, or 2.4, etc.).

Optionally, in the laminated film structure of the second dielectric layer, along a direction away from the P-type silicon substrate, the refractive indexes of each film of the laminated film increase in sequence.

In the present application, the use of a laminated film with such an arrangement of refractive index in the second dielectric layer can increase the short-circuit current. This is because the laminated film structure with high-low refractive index arrangement can enhance the back-surface light reflection and ensure the absorption and utilization of the long-wavelength of light.

Exemplarily, the laminated film structure of the second dielectric layer may be a three-layer film structure, and along the direction away from the P-type silicon substrate there are a first film of the second dielectric layer, a second film of the second dielectric layer, and a third film of the second dielectric layer, respectively. The refractive index of the first film of the second dielectric layer is 1.5 to 2.2, the refractive index of the second film of the second dielectric layer is 1.6 to 2.3, and the refractive index of the third film of the second dielectric layer is 1.7 to 2.4.

As an optional technical solution of the present application, the third dielectric layer comprises a silicon-containing layer.

Optionally, the third dielectric layer is any one or a combination of at least two of a silicon oxide layer, a silicon oxynitride layer, a silicon nitride layer, and a silicon carbide layer.

Optionally, the thickness of the third dielectric layer is 1 to 200 nm, for example, 20 nm, 50 nm, 70 nm, 80 nm, 90 nm, 100 nm, 120 nm, 135 nm, 140 nm, 160 nm, 180 nm or 200 nm, etc.

In the present application, if the thickness of the third dielectric layer is too thin, the blocking effect of the film on the corrosiveness of the back aluminum paste or silver (Ag) paste will be weakened, and the passivation effect of the laminated film will be affected. If the thickness of the third dielectric layer is too thick, a high-energy laser is required for the back-surface laser grooving. The high energy of the laser causes a reduction in the lifetime of the silicon wafer and reduces the conversion efficiency of the cells. If the thickness of film is too thick or too thin, the back reflection effect will also be weakened at the same time.

Optionally, the refractive index of the third dielectric layer is 1.5 to 2.4, for example, 1.5, 1.6, 1.7, 1.8, 1.9, 2.0, 2.1, 2.2, 2.3 or 2.4, etc.

Optionally, the third dielectric layer is a laminated film structure with different refractive indexes.

Optionally, the third dielectric layer is a laminated film structure of silicon nitride with a refractive index ranging from 1.6 to 2.2 (for example, a refractive index of 1.6, 1.7, 1.8, 1.9, 2.0, 2.1, or 2.2, etc.) and silicon nitride with a refractive index ranging from 1.9 to 2.4 (for example, a refractive index of 1.9, 2.0, 2.1, 2.2, 2.3, or 2.4, etc.).

Optionally, in the laminated film structure of the third dielectric layer, along a direction away from the P-type silicon substrate, the refractive indexes of each film of the laminated film increase in sequence.

In the present application, the use of a laminated film with such an arrangement of refractive index in the third dielectric layer can increase the short-circuit current. This is because the laminated film structure with high-low refractive index arrangement can enhance the back-surface light reflection and ensure the absorption and utilization of the long-wavelength of light.

Exemplarily, the laminated film structure of the third dielectric layer may be a three-layer film structure, and along the direction away from the P-type silicon substrate there are a first film of the third dielectric layer, a second film of the third dielectric layer, and a third film of the third dielectric layer, respectively. The refractive index of the first film of the third dielectric layer is 1.5 to 2.2, the refractive index of the second film of the third dielectric layer is 1.6 to 2.3, and the refractive index of the third film of the third dielectric layer is 1.7 to 2.4.

As another optional technical solution of the laminated passivation structure of solar cell described in the present application, the first dielectric layer is a silicon oxide layer with a thickness of 1 to 10 nm (for example, 1 nm, 5 nm, 8 nm, or 10 nm, etc.), the second dielectric layer is a silicon oxynitride layer with a thickness of 1 to 80 nm (for example, 1 nm, 10 nm, 20 nm, 30 nm, 40 nm, 50 nm, 60 nm, 70 nm or 80 nm, etc.), the third dielectric layer is a silicon nitride layer with a thickness of 1 to 100 nm (for example, 1 nm, 10 nm, 20 nm, 30 nm, 40 nm, 50 nm, 60 nm, 70 nm, 80 nm or 100 nm, etc.).

As another optional technical solution of the laminated passivation structure of solar cell described in the present application, the first dielectric layer is a silicon oxide layer with a thickness of 1 to 10 nm, and the second dielectric layer is a silicon carbide layer with a thickness of 1 to 80 nm, and the third dielectric layer is a silicon nitride layer with a thickness of 1 to 100 nm.

As an optional technical solution of the present application, the laminated passivation structure of solar cell further comprises a N-type emitter, i.e. a $N^{++}$ heavily diffused region and a $N^+$ lightly diffused region, a fourth dielectric layer and a fifth dielectric layer sequentially arranged on the front surface of the P-type silicon substrate from inside to outside.

In the present application, the $N^+$ lightly diffused region refers to a region with a relatively low phosphorus concentration formed by phosphorus doping, and the $N^{++}$ heavily diffused region refers to a region with a relatively high phosphorus doping concentration formed by laser doping or high-temperature diffusion in order to obtain a better metal contact resistance and a lower recombination current in the metal zone.

Optionally, the fourth dielectric layer (9) is a $SiO_2$ layer.

Optionally, the thickness of the fourth dielectric layer (9) is 1 to 10 nm, for example, 1 nm, 2 nm, 4 nm, 6 nm, 8 nm, or 10 nm, etc.

Optionally, the fifth dielectric layer (6) is any one or a combination of at least two of a silicon oxide layer, a silicon oxynitride layer, a silicon nitride layer, and a silicon carbide layer.

Optionally, the fifth dielectric layer (6) is a $SiN_x$ layer with a thickness of 25 to 100 nm (for example, 25 nm, 50 nm, 75 nm, or 100 nm, etc.).

Optionally, the laminated passivation structure of solar cell further comprises a front Ag electrode contacting with the $N^{++}$ heavily diffused region through the fifth dielectric layer and the fourth dielectric layer.

Optionally, the laminated passivation structure of solar cell further comprises an aluminum back field connecting with the P-type silicon substrate after passing through the third dielectric layer, the second dielectric layer and the first dielectric layer in sequence.

Optionally, the diffusion sheet resistance of the $N^+$ lightly diffused region (8) is 120 to 300 ohm/sq, for example, 120 ohm/sq, 150 ohm/sq, 180 ohm/sq, 200 ohm/sq, 150 ohm/sq or 300 ohm/sq, etc.

Optionally, the diffusion sheet resistance of the $N^{++}$ heavily diffused region (7) is 40 to 100 ohm/sq, for example, 40 ohm/sq, 50 ohm/sq, 60 ohm/sq, 70 ohm/sq, 80 ohm/sq, 90 ohm/sq or 100 ohm/sq, etc.

As an optional technical solution of the laminated passivation structure of solar cell described in the present application, the laminated passivation structure of solar cell comprises: a P-type silicon substrate, and the front surface of the P-type silicon substrate is sequentially provided with an emitter junction region and a first $SiN_x$ film from inside to outside, a Ag electrode passes through the first SiN film and then connects with the emitter junction region, the back surface of the P-type silicon substrate is sequentially provided with a second $SiO_2$ film, a $SiO_xN_y$ film and a second $SiN_x$ film from inside to outside, an aluminum back field passes through the second $SiN_x$ film, the $SiO_xN_y$ film and the second $SiO_2$ film in sequence and then contacts with the P-type silicon substrate.

Optionally, the thickness of the second $SiO_2$ film is 0 to 10 nm, for example, 1 nm, 2 nm, 3 nm, 4 nm, 5 nm, 6 nm, 7 nm, 8 nm, 9 nm or 10 nm, etc.

Optionally, the $SiO_xN_y$ film is deposited by a PECVD method, with a thickness of 1 nm to 100 nm, for example, 1 nm, 10 nm, 20 nm, 30 nm, 40 nm, 50 nm, 60 nm, 70 nm, 80 nm or 100 nm, etc.

Optionally, the second $SiN_x$ film is a $SiN_x$ layer deposited by a PECVD method, with a thickness of 10 nm to 150 nm, for example, 10 nm, 20 nm, 30 nm, 40 nm, 50 nm, 60 nm, 70 nm, 80 nm, 100 nm, 120 nm, 130 nm or 150 nm, etc.

Optionally, the second $SiN_x$ film has a thickness of 10 nm to 150 nm, for example, 10 nm, 20 nm, 30 nm, 40 nm, 50 nm, 60 nm, 70 nm, 80 nm, 100 nm, 120 nm, 130 nm or 150 nm, etc.

Optionally, the $SiO_xN_y$ film is a $SiO_xN_y$ laminated film with different refractive indexes.

Optionally, the second $SiN_x$ film is a separate $SiN_x$ passivation layer or a $SiN_x$ laminated film with different refractive indexes.

Optionally, the emitter junction region includes a $N^{++}$ heavily diffused region, a $N^+$ lightly diffused region and a first $SiO_2$ film which are arranged on the front surface of the P-type silicon substrate from inside to outside.

Optionally, the diffusion sheet resistance of the $N^+$ lightly diffused region is 120 to 180 ohm/sq, for example, 120 ohm/sq, 130 ohm/sq, 145 ohm/sq, 160 ohm/sq, or 180 ohm/sq, etc.; the diffusion sheet resistance of the $N^{++}$ heavily diffused region is 40 to 100 ohm/sq, for example, 40 ohm/sq, 65 ohm/sq, 85 ohm/sq or 100 ohm/sq, etc.

Optionally, the thickness of the first $SiO_2$ film is 1 to 10 nm, for example, 1 nm, 5 nm, or 10 nm, etc.; the thickness of the first $SiN_x$ film is 25 to 100 nm, for example, 30 nm, 40 nm, 50 nm, 60 nm, 70 nm, 80 nm or 100 nm, etc.

In a second aspect, the present application provides a method for preparing the laminated passivation structure of solar cell as described in the first aspect, and the method comprises the following steps:

generating a first dielectric layer on the back surface of the P-type silicon substrate, and then sequentially depositing a second dielectric layer, and a third dielectric layer on the first dielectric layer.

The method provided by the present application has a simple operation, a short process, a low cost, and is easy to carry out large-scale industrial production, which can make the laminated passivation structure of solar cell provided in the first aspect have a good industrialization prospect.

As an optional technical solution of the present application, the growth method of the first dielectric layer is a thermal oxidation method, a solution method or a PECVD method.

Optionally, the second dielectric layer is deposited by PECVD.

Optionally, the third dielectric layer is deposited by PECVD.

As an optional technical solution of the present application, the method further comprises: preparing a $N^{++}$ heavily diffused region and a $N^+$ lightly diffused region, and depositing a fourth dielectric layer and a fifth dielectric layer.

Optionally, the fourth dielectric layer is deposited by PECVD.

Optionally, the fifth dielectric layer is deposited by PECVD.

As a further optional technical solution of the preparation method described in the present application, the method comprises the following steps:

removing a mechanical damaged layer of a P-type silicon substrate with an alkaline etching solution, and then etching the surface of the silicon substrate by use of the alkaline etching solution to form a pyramid structure on the front surface of the P-type silicon substrate; after that, performing diffusion to form a $N^+$ lightly diffused region on the front surface of the P-type silicon substrate, and performing laser doping to obtain a $N^{++}$ heavily diffused region; removing the back junction of the P-type silicon substrate, and polishing the back surface of the P-type silicon substrate; oxidation generating a first dielectric layer and a fourth dielectric layer on the P-type silicon substrate, and then sequentially depositing a second dielectric layer and a third dielectric layer on the first dielectric layer, and depositing a fifth dielectric layer on the fourth dielectric layer; printing a back Ag electrode and drying, then printing a back Al paste to form an aluminum back field, and printing a front Ag electrode.

Compared with the prior art, the present application has the following beneficial effects:

The laminated passivation structure of solar cell provided by the present application has a better interfacial chemical passivation effect and the abundant hydrogen ions and hydrogen atoms in the film can effectively passivate impurities and defects in the body. At the same time, the back-surface light reflection effect of the cell is greatly enhanced through the optimization of the refractive indexes of each dielectric film. The laminated passivation structure of solar cell provided by the present application has an open-circuit voltage of up to 690 mV or more, a short-circuit current of 40.7 mA/cm² or more, and a conversion efficiency of up to 22.89% or more. Therefore, the laminated passivation structure of solar cell of the present application has the same passivation effect and light reflection effect as the traditional solution.

BRIEF DESCRIPTION OF THE DRAWINGS

FIG. 1 is a schematic diagram of a laminated passivation structure of solar cell provided in Example 1, wherein:

in which:
1—P-type silicon substrate,
2—first dielectric layer,
3—second dielectric layer,
4—third dielectric layer,
6—fifth dielectric layer,
7—$N^{++}$ heavily diffused region,
8—$N^+$ lightly diffused region,
9—fourth dielectric layer.

Figure 1A:
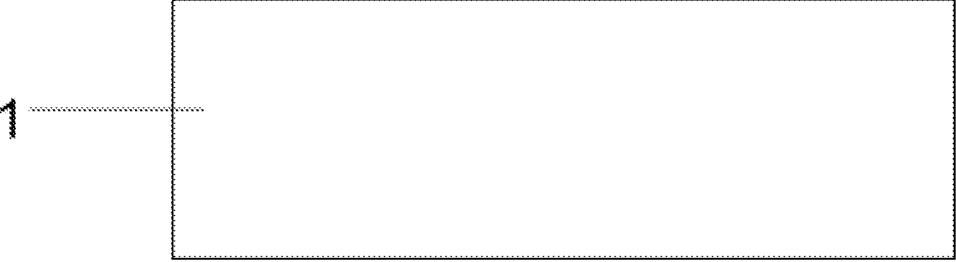
FIGS. 1A-1G show schematic diagrams of the solar cells in different stages according to the preparation method of Example 1 (the front surface of the cell is a textured structure, and is intentionally drawn as a plane for simple illustration)
Figure 1B:
Figure 1C:
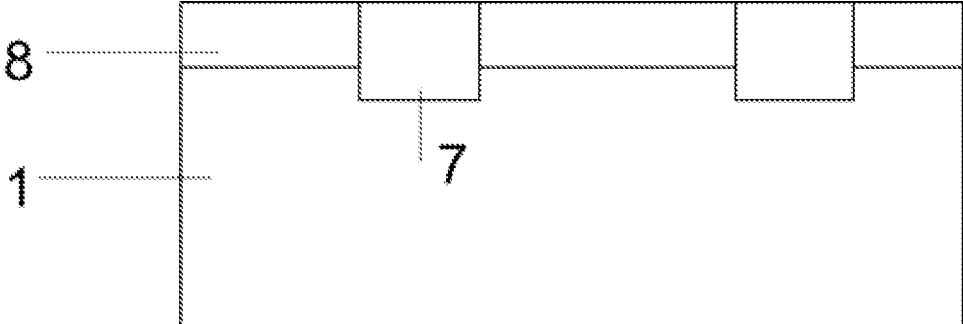
Figure 1D:
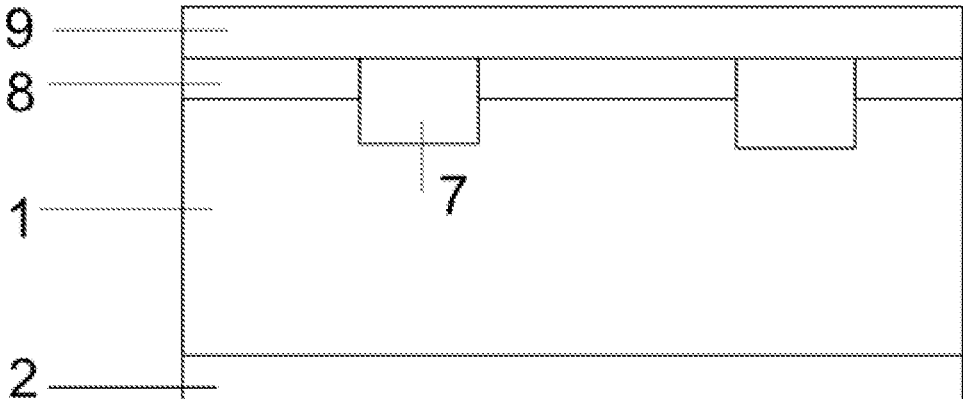
Figure 1E:
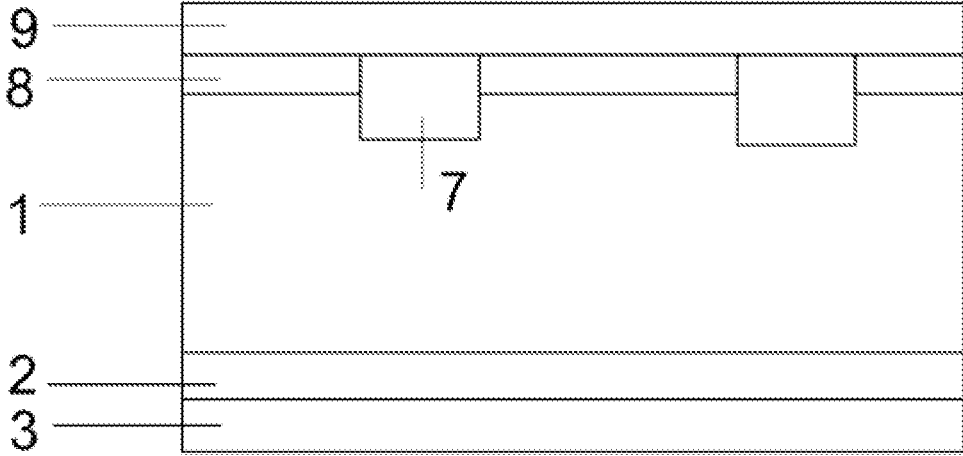
Figure 1F:
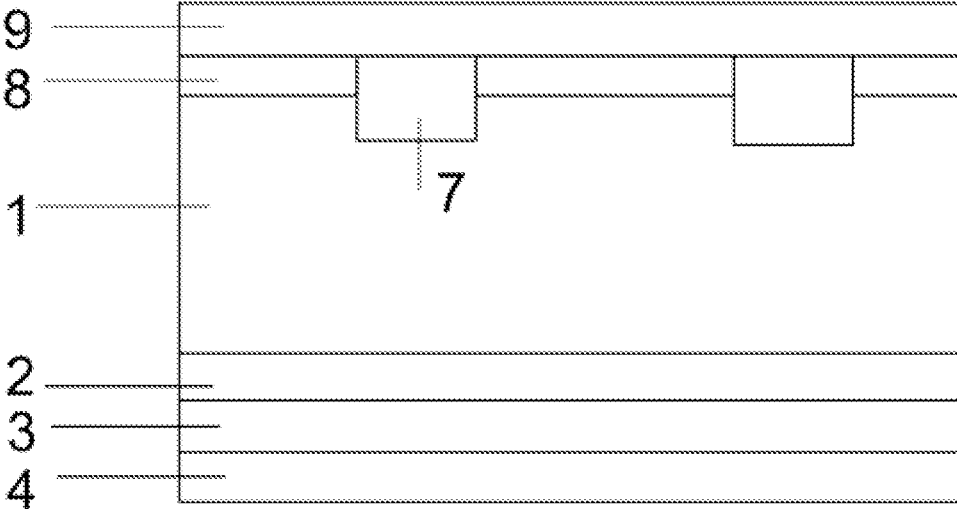
Figure 1G:
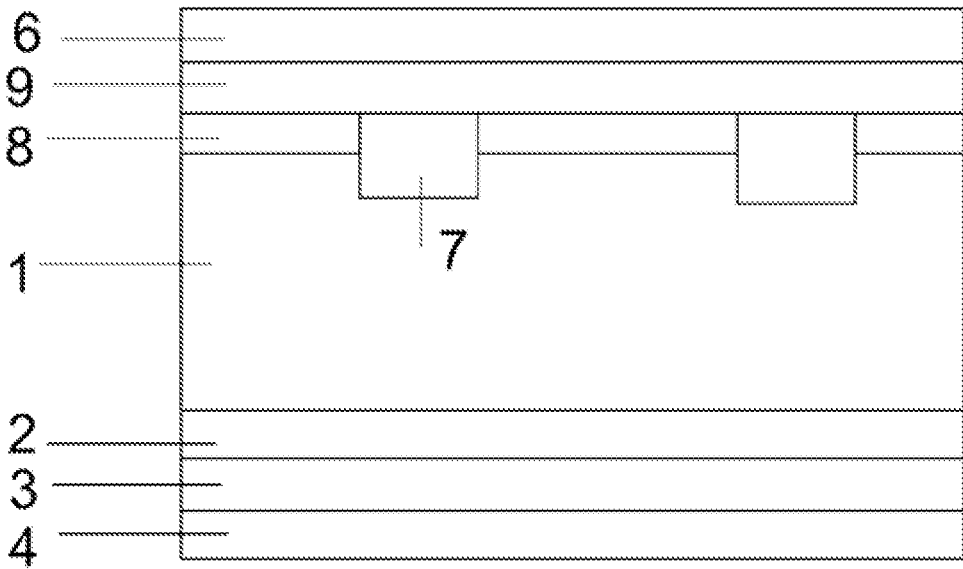
Figure 2:
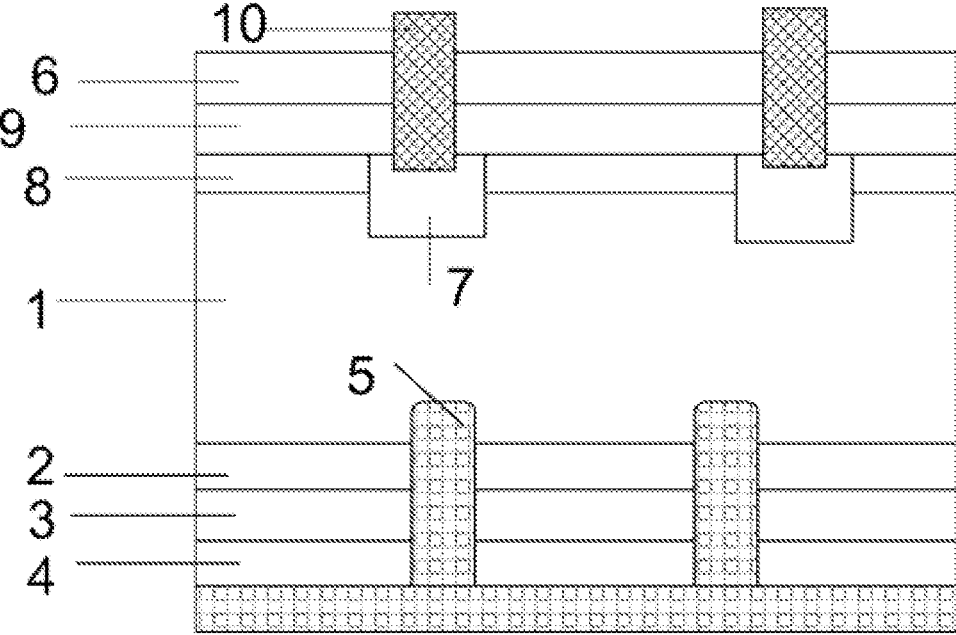

FIG. 2 shows a schematic cross-sectional view of the laminated passivation structure of solar cell provided in Example 1 (the front surface of the cell is a textured structure, and is intentionally drawn as a plane for simple illustration)

in which:
1—P-type silicon substrate,
2—first dielectric layer,
3—second dielectric layer,
4—third dielectric layer,
5—aluminum back field,
6—fifth dielectric layer,
7—$N^{++}$ heavily diffused region,
8—$N^+$ lightly diffused region,
9—fourth dielectric layer,
10—front Ag electrode.

Figure 3:
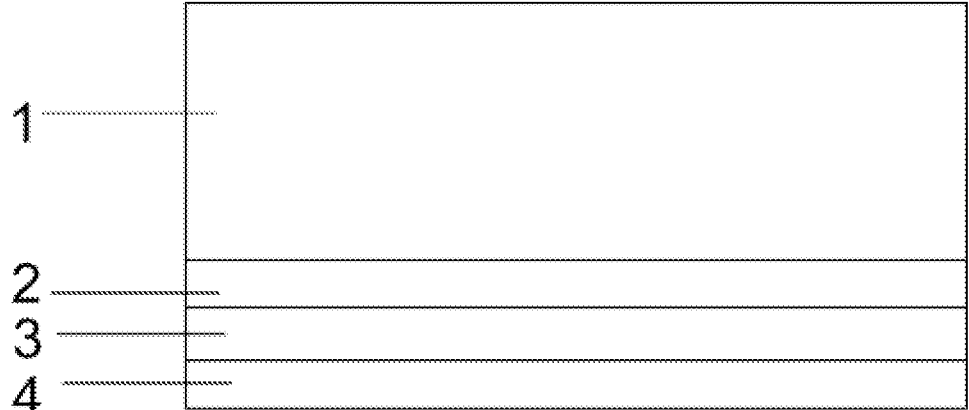

FIG. 3 shows a schematic cross-sectional view of the laminated passivation structure provided of solar cell in Example 1 (the front surface of the cell is a textured structure, and is intentionally drawn as a plane for simple illustration)

in which:
1—P-type silicon substrate,
2—first dielectric layer,
3—second dielectric layer,
4—third dielectric layer.

DETAILED DESCRIPTION OF THE EMBODIMENTS

In order to better explain the present application and facilitate the understanding of the technical solutions of the present application, the present application will be further described in detail below. However, the following examples are only simple examples of the present application, and do not represent or limit the protection scope of the claims of the present application, which is subject to the claims.

In the present application, as a specific embodiment, the laminated passivation structure of solar cell comprises: a P-type silicon substrate, and the front surface of the P-type silicon substrate is sequentially provided with an emitter junction region and a first $SiN_x$ film from inside to outside, a Ag electrode passes through the first $SiN_x$ film and then connects with the emitter junction region, the back surface of the P-type silicon substrate is sequentially provided with a second $SiO_2$ film, a $SiO_xN_y$ film and a second $SiN_x$ film from inside to outside, an aluminum back field passes through the second $SiN_x$ film, the $SiO_xN_y$ film and the second $SiO_2$ film in sequence and then contacts with the P-type silicon substrate.

The emitter junction region includes a $N^{++}$ heavily diffused region, a $N^+$ lightly diffused region and a first $SiO_2$ film which are arranged on the front surface of the P-type silicon substrate from inside to outside.

The thickness of the second $SiO_2$ film is 0 to 10 nm. The $SiO_xN_y$ film is deposited by a PECVD method, with a thickness of 1 to 100 nm. The second $SiN_x$ film is a $SiN_x$ layer deposited by a PECVD method, and has a thickness of 10 nm to 150 nm. The second $SiN_x$ film has a thickness of 10 nm to 150 nm. The first $SiO_2$ film has a thickness of 0 to 10 nm, and the first $SiN_x$ film has a thickness of 25 to 100 nm.

The second $SiO_xN_y$ film is a separate $SiO_xN_y$ passivation layer or a $SiO_xN_y$ laminated film with different refractive indexes.

The second $SiN_x$ film is a separate $SiN_x$ passivation layer or a $SiN_x$ laminated film with different refractive indexes.

The diffusion sheet resistance of the N$^+$ lightly diffused region is 120 to 180 ohm/sq, and the diffusion sheet resistance of the N$^{++}$ heavily diffused region is 40 to 100 ohm/sq.

In this embodiment, the film on the back surface of the P-type silicon substrate contains a large amount of H$^+$, which will be injected into the surface and the interior of the silicon wafer during the subsequent annealing process or sintering process to passivate the recombination center.

As another specific embodiment, the laminated passivation structure of solar cell comprises: a P-type silicon substrate, and the front surface of the P-type silicon substrate is sequentially provided with an emitter junction region and a first SiN$_x$, film from inside to outside, a Ag electrode passes through the first SiN$_x$ film and then connects with the emitter junction region, the back surface of the P-type silicon substrate is sequentially provided with a second SiO$_2$ film, a SiO$_x$N$_y$ film and a second SiN$_x$ film from inside to outside, an aluminum back field passes through the second SiN$_x$ film, the SiO$_x$N$_y$ film and the second SiO$_2$ film in sequence and then contacts with the P-type silicon substrate. The emitter junction region 2 includes a N$^{++}$ heavily diffused region, a N$^+$ lightly diffused region and a first SiO$_2$ film which are arranged on the front surface of the P-type silicon substrate from inside to outside.

Specifically, 47% by volume of a potassium hydroxide (KOH) solution is used to remove the mechanical damaged layer of the P-type silicon substrate by 2 to 3 μm, and then 47% by volume of a KOH solution is used to etch the surface of the silicon wafer to form a pyramid structure of 2 to 3 μm.

POCl$_3$ liquid-low-pressure diffusion is used to form a p-n junction, i.e. a N$^+$ lightly diffused region, the diffusion temperature is 810° C., the process time is 90 min, and the diffusion sheet resistance is controlled as 120 to 180 ohm/sq.

Laser selective emitter (SE) doping, the phosphorous atoms in the phosphorosilicate glass after the diffusion is laser doped by the high temperature of laser to form a local heavy doping region, which is the N$^{++}$ heavily diffused region with a diffusion sheet resistance of 40 to 100 ohm/sq.

The back junction of the P-type silicon substrate is removed by a chain cleaning machine, and the back surface of the silicon wafer is polished by 3 to 4 μm to remove the peripheral p-n junction.

Oxidation is conducted on the front surface, the back surface, and the edges of the P-type silicon substrate wafer to generate thin SiO$_2$ films, which are the first SiO$_2$ film and the second SiO$_2$ film with a thickness of 0 to 10 nm.

The back-surface SiO$_x$N$_y$ film is deposited by PECVD, with a thickness of 1 to 100 nm.

The back-surface second SiN$_x$ film is deposited by PECVD, with a thickness of 10 to 150 nm.

The front-surface first SiN$_x$ film is deposited by PECVD, with a thickness of 25 to 100 nm.

A 532 nm ns laser is used to make local grooving on the back laminated film to open the laminated passivation film.

After a back Ag electrode is printed and dried, a back Al paste is then printed.

A front Ag cell is printed and quickly sintered at 875° C. to form a good ohmic contact of Ag electrode.

As yet another specific embodiment, the laminated passivation structure of solar cell comprises: a P-type silicon substrate, and the front surface of the P-type silicon substrate is sequentially provided with an emitter junction region and a first SiN$_x$ film from inside to outside, a Ag electrode passes through the first SiN$_x$ film and then connects with the emitter junction region, the back surface of the P-type silicon substrate is sequentially provided with a SiO$_x$N$_y$ film, and a second SiN$_x$, film from inside to outside, an aluminum back field passes through the second SiN$_x$ film, and the SiO$_x$N$_y$ film in sequence and then contacts with the P-type silicon substrate. The emitter junction region includes a N$^{++}$ heavily diffused region, a N$^+$ lightly diffused region and a first SiO$_2$ film which are arranged on the front surface of the P-type silicon substrate 1 from inside to outside.

47% by volume of a KOH solution is used to remove the mechanical damaged layer of the P-type substrate by 2 to 3 μm, and then 47% by volume of a KOH solution is used to etch the surface of the silicon wafer to form a pyramid structure of 2 to 3 μm.

POCl$_3$ liquid-low-pressure diffusion is used to form a N$^+$ lightly diffused region, the diffusion temperature is 810° C., the process time is 90 min, and the diffusion sheet resistance is controlled as 120 to 180 ohm/sq.

Laser SE doping, the phosphorous atoms in the phosphorosilicate glass after the diffusion is laser doped by the high temperature of laser to form a local N$^{++}$ heavily diffused region, and the diffusion sheet resistance is 40 to 100 ohm/sq.

The back junction is removed by a chain cleaning machine, and the back surface of the silicon wafer is polished by 3 to 4 μm to remove the peripheral p-n junction.

Oxidation is conducted on the front surface and the edges of the silicon wafer to generate a thin SiO$_2$ film, which is a first SiO$_2$ film with a thickness of 0 to 10 nm.

The back-surface SiO$_x$N$_y$ film and the second SiN$_x$ film are deposited by PECVD, with thicknesses of 1 to 100 nm and 10 to 150 nm, respectively. The front-surface first SiN$_x$ film is deposited by PECVD, with a thickness of 25 to 100 nm.

A 532 nm ns laser is used to make local grooving on the back laminated film to open the laminated passivation film.

After a back Ag electrode is printed and dried, a back Al paste is then printed. A front Ag cell is printed and quickly sintered at 875° C. to form a good ohmic contact.

The following are typical but non-limiting examples of the present application:

Example 1

This example provides a laminated passivation structure of solar cell, as shown in FIG. 2 and FIG. 3. The passivation structure of solar cell includes a P-type silicon substrate 1, and the back surface of the P-type silicon substrate 1 is sequentially provided with a first dielectric layer 2, a second dielectric layer 3, and a third dielectric layer 4, an aluminum back field 5 connecting with the P-type silicon substrate 1 after passing through the third dielectric layer 4, the second dielectric layer 3, and the first dielectric layer 2 in sequence, a N$^{++}$ heavily diffused region 7, a N$^+$ lightly diffused region 8, a fourth dielectric layer 9 and a fifth dielectric layer 6 sequentially arranged on the front surface of the P-type silicon substrate 1 from inside to outside. The laminated passivation structure of solar cell provided in this example further includes a front Ag electrode 10, and the front Ag electrode 10 passes through the fifth dielectric layer 6 and the fourth dielectric layer 9 into the N$^{++}$ heavily diffused region 7.

In the laminated passivation structure of solar cell provided in this example, the first dielectric layer 2 is a silicon oxide film with a thickness of 2 nm, the second dielectric layer 3 is a silicon oxynitride laminated film with a total thickness of 20 nm and a refractive index of 1.7, the third dielectric layer 4 is a silicon nitride laminated film with a total thickness of 70 nm and a refractive index of 2.1, the diffusion sheet resistance of the N$^+$ lightly diffused region 8 is 150 ohm/sq, the diffusion sheet resistance of the $N^{++}$ heavily diffused region 7 is 75 ohm/sq, the fourth dielectric layer 9 is a silicon oxide film with a thickness of 2 nm, and the fifth dielectric layer 6 is a silicon nitride film with a thickness of 75 nm and a refractive index of 2.0.

The second dielectric layer 3 is a three-layer silicon oxynitride laminated film, and along the direction away from the P-type silicon substrate 1 there are a first film of the second dielectric layer 3, a second film of the second dielectric layer 3, and a third film of the second dielectric layer 3, respectively. The refractive index of the first film of the second dielectric layer 3 is 1.7, the refractive index of the second film of the second dielectric layer 3 is 1.8, and the refractive index of the third film of the second dielectric layer 3 is 1.9.

The third dielectric layer 4 is a three-layer silicon nitride laminated film, and along the direction away from the P-type silicon substrate 1 there are a first film of the third dielectric layer 4, a second film of the third dielectric layer 4, and a third film of the third dielectric layer 4, respectively. The refractive index of the first film of the third dielectric layer 4 is 2.0, the refractive index of the second film of the third dielectric layer (4) is 2.1, and the refractive index of the third film of the third dielectric layer (4) is 2.2.

In the laminated passivation structure of solar cell provided in this example, the $N^+$ lightly diffused region 8 is obtained by a tubular liquid phosphorous source diffusion, and the $N^{++}$ heavily diffused region 7 is obtained by laser doping.

A method for preparing the laminated passivation structure of solar cell provided in this example, and the specific steps include:

(1) Using 2% by mass of a KOH solution to remove the mechanical damaged layer of the P-type silicon wafer by 1.5 μm, and then using 3% by mass of a KOH solution to etch the surface of the silicon wafer to form a pyramid structure with a size of 1.5 μm.

(2) Using $POCl_3$ liquid diffusion to form a $N^+$ lightly diffused region 8, with the diffusion temperature being 810° C., and the process time being 90 min.

(3) Laser SE doping, laser doping the phosphorous atoms in the phosphorosilicate glass after the diffusion by the high temperature of laser to form a local $N^{++}$ heavily diffused region 7.

(4) Removing the back junction by a chain cleaning machine, and polishing the back surface of the silicon wafer by 3.5 μm to remove the peripheral p-n junction.

(5) Generating thin silicon oxide films on the back surface, the front surface, and the edges of the silicon wafer by thermal oxidation, i.e. the first dielectric layer 2 and the fourth dielectric layer 9, with a thickness of 2 nm.

(6) Depositing a silicon oxynitride film on the back surface by PECVD, i.e. the second dielectric layer 3; depositing a silicon nitride film on the back surface by PECVD, i.e. the third dielectric layer 4.

(7) Depositing a silicon nitride film on the front surface by PECVD, i.e. the fifth dielectric layer 6.

(8) Using a 532 nm ns laser to make local grooving on the back laminated film to open the laminated passivation film.

(9) After printing a back Ag paste and drying, and then printing a back Al paste 5 and drying, printing a front Ag paste 10 and quickly sintering at 875° C. to form a good ohmic contact.

FIG. 1A, FIG. 1B, FIG. 1C, FIG. 1D, FIG. 1E, FIG. 1F, and FIG. 1G are schematic diagrams of solar cells in different stages according to the above-mentioned preparation methods.

Example 2

The laminated passivation structure of solar cell provided in this example refers to Example 1, and the differences lie in that the first dielectric layer 2 is a silicon oxide film with a thickness of 2 nm, the second dielectric layer 3 is a laminated film consisting of a silicon oxynitride film, a silicon nitride film and a silicon carbide film with a total thickness of 20 nm and a refractive index of 1.7, the third dielectric layer 4 is a two-layer silicon nitride film with thicknesses of 20 nm and 40 nm, respectively, the diffusion sheet resistance of the $N^+$ light diffusion region 8 is 150 ohm/sq, the diffusion sheet resistance of the $N^{++}$ heavy diffusion region 7 is 75 ohm/sq, the fourth dielectric layer 9 is a $SiO_2$ film with a thickness of 2 nm, and the fifth dielectric layer 6 is a silicon nitride film with a thickness of 75 nm and a refractive index of 2.0.

The second dielectric layer 3 is a laminated film consisting of a silicon oxynitride film, a silicon nitride film and a silicon carbide film, and along the direction away from the P-type silicon substrate 1 there are a first film of the second dielectric layer 3 (a silicon oxynitride film), a second film of the second dielectric layer 3 (a silicon nitride film), and a third film of the second dielectric layer 3 (a silicon carbide film), respectively. The refractive index of the first film of the second dielectric layer 3 is 1.7, the refractive index of the second film of the second dielectric layer 3 is 1.9 and the refractive index of the third film of the second dielectric layer 3 is 2.0.

The third dielectric layer 4 is a two-layer silicon nitride film, and along the direction away from the P-type silicon substrate 1 there are a first film of the third dielectric layer 4 and a second film of the third dielectric layer 4, respectively. The refractive index of the first film of the third dielectric layer 4 is 2.0, and the refractive index of the second film of the third dielectric layer 4 is 2.1.

A method for preparing the laminated passivation structure of solar cell provided in this example, and the specific steps include:

(1) Using 2% by mass of a KOH solution to remove the mechanical damaged layer of the P-type silicon wafer by 1.5 μm, and then using 3% by mass of a KOH solution to etch the surface of the silicon wafer to form a pyramid structure with a size of 1.5 μm.

(2) Using $POCl_3$ liquid diffusion to form a $N^+$ lightly diffused region 8, with the diffusion temperature being 810° C., and the process time being 90 min.

(3) Laser SE doping, laser doping the phosphorous atoms in the phosphorosilicate glass after the diffusion by the high temperature of laser to form a local $N^{++}$ heavily diffused region 7.

(4) Removing the back junction by a chain cleaning machine, and polishing the back surface of the silicon wafer by 3.5 μm to remove the peripheral p-n junction.

(5) Generating thin silicon oxide films on the back surface, the front surface, and the edges of the silicon wafer by thermal oxidation, i.e. the first dielectric layer 2 and the fourth dielectric layer 9, with a thickness of 2 nm.

(6) Depositing a silicon oxynitride film, a silicon nitride film and a silicon carbide film on the back surface by PECVD, i.e. the second dielectric layer 3; depositing a two-layer silicon nitride film on the back surface by PECVD, i.e. the third dielectric layer 4.

(7) Depositing a silicon nitride film on the front surface by PECVD, i.e. the fifth dielectric layer 6.

(8) Using a 532 nm ns laser to make local grooving on the back laminated film to open the laminated passivation film.

(9) After printing a back Ag paste and drying, and then printing a back Al paste 5 and drying, printing a front Ag paste 10 and quickly sintering at 875° C. to form a good ohmic contact.

Comparative Example 1

The difference between this comparative example and Example 1 lies in that the laminated passivation structure of solar cell provided by this comparative example isn't provided with the first dielectric layer 2.

Comparative Example 2

The difference between this comparative example and Example 1 lies in that the laminated passivation structure of solar cell provided by this comparative example isn't provided with the second dielectric layer 3.

Comparative Example 3

The difference between this comparative example and Example 2 lies in that the laminated passivation structure of solar cell provided by this comparative example isn't provided with the third dielectric layer 4 of the laminated structure.

The results of cells in different solutions are shown in the table below:

TABLE 1

| | Open-circuit voltage [mV] | Short-circuit current [mA/cm$^2$] | Fill factor [%] | Conversion efficiency [%] |
|---|---|---|---|---|
| Example 1 | 690 | 40.7 | 81.5 | 22.89 |
| Comparative Example 1 | 688 | 40.68 | 81.45 | 22.80 |
| Comparative Example 2 | 688 | 40.6 | 81.45 | 22.75 |
| Example 2 | 690 | 40.8 | 81.5 | 22.94 |
| Comparative Example 3 | 690 | 40.7 | 81.5 | 22.89 |

The above efficiency tests of the cell is under the standard test conditions: Irradiance 1000 W/m$^2$, Cell Temperature 25° C., Air Mass AM1.5

Compared with Example 1, since Comparative Example 1 is not provided with the first dielectric layer 2, a weakened chemical passivation effect is resulted, the cell Voc is lowered by 2 mV and the efficiency is lowered by 0.09%.

Compared with Example 1, since Comparative Example 2 is not provided with the second dielectric layer 3, a weakened back light reflection effect is resulted, at the same time the bombardment of the first dielectric layer (2) by the high-power plasma during the deposition of the third dielectric layer (4) can't be weakened, the open-circuit voltage of the cell is lowered by 2 mV, the current density is lowered by 0.1 mA/cm$^2$ and the efficiency is lowered by 0.14%.

Compared with Example 2, since Comparative Example 3 is not provided with the third dielectric layer 4 of the laminated structure, a weakened back light reflection effect is resulted, the current density is lowered by 0.1 mA/cm$^2$ and the efficiency is lowered by 0.05%.

Based on the above results, it can be seen that the back laminated passivation structure of solar cell provided in Examples 1-2 has very good chemical passivation and back reflection effects.

The applicant declares that the present application illustrates the detailed methods of the present application through the above-mentioned examples, but the present application is not limited thereto, that is, it doesn't meant that the present application can only be implemented depending on the above-mentioned detailed methods.

What is claimed is:

1. A laminated passivation structure of a solar cell comprising:

a P-type silicon substrate;

a first dielectric layer, a second dielectric layer, and a third dielectric layer sequentially arranged on a back surface of the P-type silicon substrate from inside to outside; and an additional dielectric layer disposed on a front surface of the P-type silicon substrate, wherein the first dielectric layer is a silicon oxide layer with a thickness of 1 to 10 nm, the second dielectric layer is a silicon oxynitride layer with a thickness of 1 to 50 nm, the third dielectric layer is a silicon nitride layer with a thickness of 1 to 150 nm and the additional dielectric layer is a silicon carbide layer, wherein the second dielectric layer comprises, sequentially arranged from the P-type silicon substrate:

a first silicon oxynitride film with a refractive index ranging from 1.5 to 2.2;

a second silicon oxynitride film with a refractive index ranging from 1.6 to 2.3; and a third silicon oxynitride film with a refractive index ranging from 1.7 to 2.4, wherein the refractive index of the first silicon oxynitride film is less than the refractive index of the second silicon oxynitride film, and the refractive index of the second silicon oxynitride film is less than the refractive index of the third silicon oxynitride film, and wherein the third dielectric layer is a laminated film structure comprises, sequentially arranged from the P-type silicon substrate:

a first silicon nitride film with a refractive index ranging from 1.5 to 2.2;

a second silicon nitride film with a refractive index ranging from 1.6 to 2.3; and a third silicon nitride film with a refractive index ranging from 1.7 to 2.4, and wherein the refractive index of the first silicon nitride film is less than the refractive index of the second silicon nitride film, and the refractive index of the second silicon nitride film is less than the refractive index of the third silicon nitride film.

2. The laminated passivation structure of a solar cell according to claim 1, further comprising a N++ heavily diffused region, a N+ lightly diffused region, a fourth dielectric layer and a fifth dielectric layer sequentially arranged on the front surface of the P-type silicon substrate from inside to outside, and wherein the additional dielectric layer is the fifth dielectric layer.

3. The laminated passivation structure of a solar cell according to claim 2, wherein the fourth dielectric layer is a SiO$_2$ layer.

4. The laminated passivation structure of a solar cell according to claim 2, wherein a thickness of the fourth dielectric layer is 1 to 10 nm.

5. The laminated passivation structure of a solar cell according to claim 2, further comprising a front Ag electrode contacting with the N++ heavily diffused region through the fifth dielectric layer and the fourth dielectric layer.

6. The laminated passivation structure of a solar cell according to claim 1, further comprising an aluminum back field connecting with the P-type silicon substrate after passing through the third dielectric layer, the second dielectric layer, and the first dielectric layer.

7. The laminated passivation structure of a solar cell according to claim 2, wherein a diffusion sheet resistance of the N+ lightly diffused region is 120 to 300 ohm/sq.

8. The laminated passivation structure of a solar cell according to claim 2, wherein a diffusion sheet resistance of the N++ heavily diffused region is 40 to 100 ohm/sq.

9. The laminated passivation structure of a solar cell according to claim 1, wherein the front surface of the P-type silicon substrate is sequentially provided with an emitter junction region and a first SiNx film from inside to outside, an Ag electrode passes through the first SiNx film and then connects with the emitter junction region, and wherein the first dielectric layer is a second $SiO_2$ film, the second dielectric layer is a SiOxNy film, and the third dielectric layer is a second SiNx film, an aluminum back field passes through the second SiNx film, the SiOxNy film and the second $SiO_2$ film in sequence and then contacts with the P-type silicon substrate.

10. The laminated passivation structure of a solar cell according to claim 9, wherein the emitter junction region comprises a N++ heavily diffused region, a N+ lightly diffused region and a first $SiO_2$ film which are arranged on the front surface of the P-type silicon substrate from inside to outside.

11. The laminated passivation structure of a solar cell according to claim 10, wherein a diffusion sheet resistance of the N+ lightly diffused region is 120 to 180 ohm/sq, and a diffusion sheet resistance of the N++ heavily diffused region is 40 to 100 ohm/sq.

* * * * *